United States Patent
McPhalen

(10) Patent No.: US 12,430,698 B2
(45) Date of Patent: Sep. 30, 2025

(54) EFFICIENT IMPLEMENTATION OF REVENUE AND POWER QUALITY FUNCTIONS ON A PROCESSING DEVICE

(71) Applicant: Schneider Electric USA, Inc., Andover, MA (US)

(72) Inventor: Erin C. McPhalen, Victoria (CA)

(73) Assignee: Schneider Electric USA, Inc., Boston, MA (US)

( * ) Notice: Subject to any disclaimer, the term of this patent is extended or adjusted under 35 U.S.C. 154(b) by 388 days.

(21) Appl. No.: 17/880,806

(22) Filed: Aug. 4, 2022

(65) Prior Publication Data

US 2024/0046378 A1    Feb. 8, 2024

(51) Int. Cl.
| | |
|---|---|
| *G06Q 50/06* | (2024.01) |
| *G01R 22/06* | (2006.01) |
| *H03H 17/02* | (2006.01) |
| *H03K 19/177* | (2020.01) |
| *H03H 17/00* | (2006.01) |

(52) U.S. Cl.
CPC ............ *G06Q 50/06* (2013.01); *G01R 22/06* (2013.01); *H03H 17/02* (2013.01); *H03K 19/177* (2013.01); *H03H 2017/0081* (2013.01)

(58) Field of Classification Search
CPC ........ G06Q 50/06; G01R 22/06; H03H 17/02; H03H 2017/0081; H03K 19/177
See application file for complete search history.

(56) References Cited

U.S. PATENT DOCUMENTS

| | | | | |
|---|---|---|---|---|
| 5,633,811 A | * | 5/1997 | Canada | G01H 1/00 702/56 |
| 6,005,759 A | * | 12/1999 | Hart | H02J 13/00002 361/62 |
| 2007/0067121 A1 | * | 3/2007 | Przydatek | G01R 22/06 702/57 |
| 2014/0324367 A1 | * | 10/2014 | Garvey, III | G01D 18/00 702/56 |

OTHER PUBLICATIONS

Arar (Design of FIR Filters Using the Frequency Sampling Method, All About Circuits, Sep. 29, 2017) (Year: 2017).*

* cited by examiner

*Primary Examiner* — Lisa M Caputo
*Assistant Examiner* — Christian T Bryant

(57) ABSTRACT

Methods, devices, and systems are provided for improving efficiency of power quality and revenue-based computations which include receiving an input signal and oversampling the input signal to generate an oversampled data stream. In a first signal path, the oversampled data stream is filtered to generate a filtered data stream, and the filtered data stream is decimated to generate a decimated data stream. The filtered data stream and the decimated data stream include waveform data capable of use for generating power quality analysis information. In a second signal path, the oversampled data stream is downsampled to generate a downsampled data stream, and revenue quality power consumption data is generated based at least in part upon meta data from the downsampled data stream. Power quality data is generated based at least in part upon the decimated data stream and associated meta data.

25 Claims, 5 Drawing Sheets

140A

200

EFFICIENT IMPLEMENTATION OF REVENUE AND POWER QUALITY FUNCTIONS ON A PROCESSING DEVICE

TECHNICAL FIELD

The present disclosure relates to power meters, and more particularly to providing efficient implementation of revenue and power quality functions.

BACKGROUND

Existing power metering systems include numerous deficiencies, for example in relation to reduced efficiency while providing both power quality and revenue measurement and verification. Some previous systems, such as described in U.S. Pat. No. 7,962,298 describe the separation of two different sets of metadata for power quality and revenue data, in addition to the waveform data for International Electrotechnical Commission (IEC) 61000 4-30 filter calculation. This downfalls in terms of required processing and hardware requirements, thereby limits system capabilities and implementation possibilities, for example based upon hardware requirements.

SUMMARY

Implementations consistent with the present disclosure may provide numerous benefits, such as allowing both power quality and revenue to be generated from an oversampled Analog-to-Digital Converter (ADC) data stream, resulting in very efficient calculations for both while reducing or eliminating hardware requirements of existing solutions.

Implementations consistent with the present disclosure may be configured to meet International Electrotechnical Commission (IEC) 61000 4-30 current requirements and to provide improved efficiencies over existing systems. Embodiments may include sampling an ADC at a sample rate sufficient to apply a Finite Impulse Response (FIR) filter to meet IEC 61000 4-30 Power Quality requirements and at the same time use a decimated data stream for revenue calculations. The 4-30 Power Quality stream may require waveform data to produce a Finite Fourier Transform (FFT). Both the power quality stream and the revenue stream may utilize metadata which includes sum, sum of squares, and/or min/max value over a fraction of the waveform in order to produce accurate results. Implementations consistent with the present disclosure may provide an oversampled data path to support an FIR filter and a decimated path for the revenue data. This may result in waveforms and metadata for power quality and metadata to complete revenue calculations. This is highly efficient compared to existing solutions.

In various embodiments, allowing both power quality and revenue to be generated from an oversampled ADC data stream may result in very efficient calculations for both. Numerous benefits may be obtained by oversampling an ADC output then applying an FIR filter to simplify FFT calculation according to aspects of the present disclosure, while still maintaining revenue accuracy through a second set of metadata.

Implementations consistent with the present disclosure may enable IEC 61000 4-30 Power Quality features without changing existing Field Programmable Gate Array (FPGA) components. By using oversampling for the FIR filter to meet 4-30 requirements and then downsampling for revenue components efficient implementation is provided by enabling maintaining existing hardware components, such as an FPGA, Digital Signal Processor (DSP), and/or other processing device.

Implementations consistent with the present disclosure may include a method for improving efficiency of power quality and revenue-based computations. The method may include receiving an input signal, oversampling the input signal to generate an oversampled data stream, (i) in a first signal path, filtering the oversampled data stream to generate a filtered data stream, and decimating the filtered data stream to generate a decimated data stream, the filtered data stream and the decimated data stream including waveform data capable of use for generating power quality analysis information, (ii) in a second signal path, downsampling the oversampled data stream to generate the downsampled data stream, generating revenue quality power consumption data based at least in part upon meta data from the downsampled data stream, and generating power quality data based at least in part upon the decimated data stream and associated meta data.

The filtered data stream may have a linear phase shift (e.g., a linear constant phase shift). The input signal may be received from an ADC. The ADC may provide input signal data at a sample rate, for example, in accordance with power quality requirements (e.g., IEC 61000 4-30 power quality requirements) in some embodiments. Waveform data and metadata or a representation(s) thereof may be visually displayed or transmitted. The method of filtering the oversampled input data stream may include performing FIR filtering operation. Generating power quality data may include producing an FFT for power quality analysis.

According to aspects of the present disclosure, provided is a device for providing power quality and revenue-based computations. The device may include a converter configured to receive input data and to output a converted data stream, a filter section coupleable to the converter and configured to receive at least a portion of the converted data stream and perform at least one filter operation to generate a filtered data stream, a decimation section configured to receive the filtered data stream and to perform at least one decimation operation on the filtered data stream to generate a decimated data stream, a downsample section configured to receive the converted data stream and to perform at least one downsampling operation to generate a downsampled data stream, and a processor configured to receive the decimated data stream and the downsampled data stream and to generate waveform data and metadata.

The converter may be an ADC. The ADC may provide the converted data stream at a sample rate, for example, in accordance with power quality requirements (e.g., IEC 61000 power quality requirements) in some embodiments. The converted data stream may be an oversampled data stream at the sample rate. The converted data stream may be an oversampled data stream. The device may include a display unit which visually conveys one or more of the waveform data and metadata, or a representation thereof. The at least one filter operation may include performing an FIR filtering operation. The converted data stream may have a linear phase shift. The filter section, the decimation section, the downsample section, and the processor may be implemented in whole or in part by an FPGA, DSP, and/or other processing device of the device.

Implementations consistent with the present disclosure may further include a system for providing improving efficiency of power quality and revenue-based computations. The system may include a power source configured to provide output power and a device. The device may include a converter configured to receive the output power from the power source and to output a converted data stream, a filter section coupleable to the converter and configured to receive at least a portion of the converted data stream and perform at least one filter operation to generate a filtered data stream, a decimation section configured to receive the filtered data stream and to perform at least one decimation operation on the filtered data stream to generate a decimated data stream, a downsample section configured to receive the converted data stream and to perform at least one downsampling operation to generate a downsampled data stream, and a processor configured to receive the decimated data stream and the downsampled data stream and to generate waveform data and metadata.

The converter may be an ADC. The ADC may provide the converted data stream a sample rate, for example, in accordance with power quality requirements (e.g., IED 61000 4-30 power quality requirements) in some embodiments. The converted data stream may be an oversampled data stream at the sample rate. The converted data stream may be an oversampled data stream. The system may further include a display unit used to visually convey one or more of the waveform data and metadata, or a representation thereof. The at least one filter operation may include performing an FIR filtering operation. The converted data stream may have a linear phase shift. The filter section, the decimation section, and the downsample section may be implemented in whole or in part by an FPGA, DSP, and/or other processing device of the device.

Numerous other objects, features, and advantages of the present invention will be readily apparent to those skilled in the art upon a reading of the following disclosure when taken in conjunction with the accompanying drawings.

Figure 1:
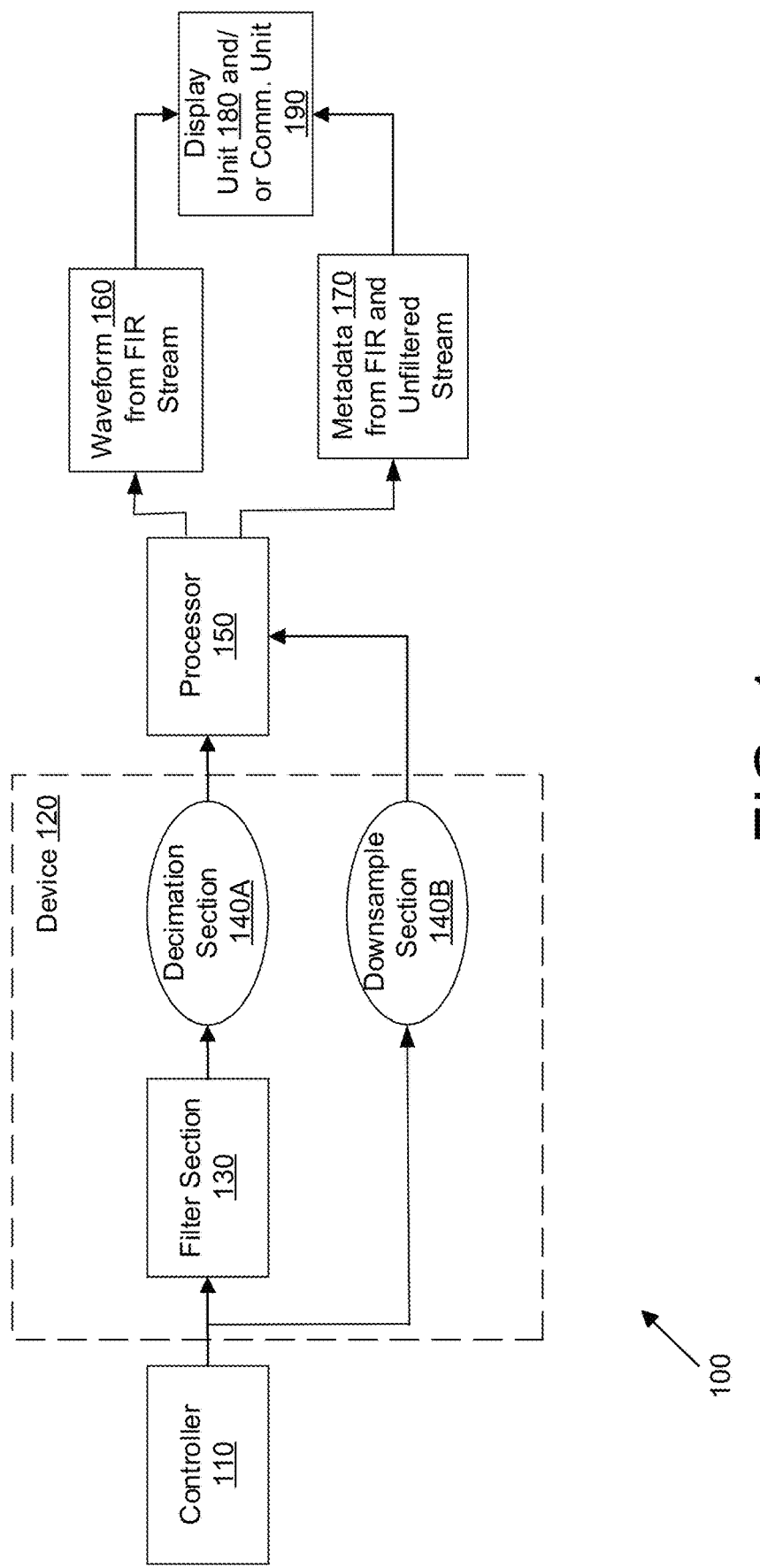
FIG. 1 illustrates a partial block diagram of an exemplary embodiment of a device according to aspects of the present disclosure.

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

FIG. 1 illustrates a partial block diagram of an exemplary embodiment of a device according to aspects of the present disclosure. The device 100 includes one or more of a converter 110, a device 120, a processor 150, a waveform 160, metadata 170, display unit 180, and/or communication unit 190. The converter 110 may be an Analog-to-Digital Converter (ADC) coupleable to the device 120, for example via one or more wired and/or wireless connections. The converter 110 may be an AD7606 ADC in some embodiments. Additionally or alternatively, the converter 110 or element or operation corresponding thereto may be provided in whole or in part by the device 120. The device 120 may be a Field Programmable Gate Array (FPGA) in various embodiments, such as an Altera Cyclone® IV or Lattice Certus™ NX, although one or more FPGA or various components thereof may perform one or more operations of the device 120 in various embodiments. Additionally or alternatively, the device 120 may be, may include, or may be coupleable to a Digital Signal Processor (DSP) or other processing device to perform or assist in performing at least one operations corresponding to the device 120. The device 120 may include one or more of the filter section 130, the decimation section 140A, and/or the downsample section 140B. It should be appreciated that one or more of the converter 110, the processor 150, the waveform 160, the metadata 170, the display unit 180, and/or the communication unit 190 may be included with the device 120 or may be either physically or logically separate from the device 120 without departing from the spirit and scope of the present disclosure. Although described as a processor, it should be appreciated that the processor 150 may be any hardware and/or software processing element capable of performing one or more computations or operations. In some embodiments, the processor 150 may be a Spear SP1380 microprocessor, although not limited to such. The processor 150 may be or include a DSP, for example.

Figure 3:
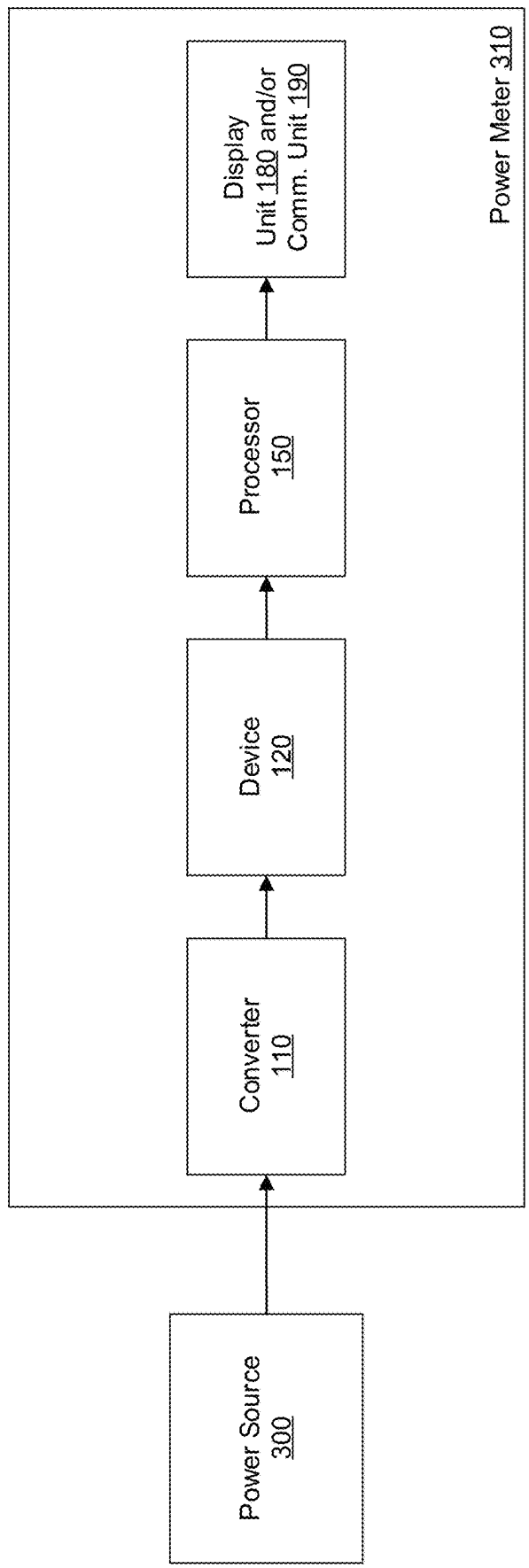
FIG. 3 illustrates a partial block diagram of an exemplary embodiment of a system consistent with the present disclosure.

The converter 110 may be configured to receive input power signal, for example from a power source 300, as illustrated and described herein with reference to FIG. 3. The converter 110 may be configured to oversample the input power signal to create an oversampled data stream and output from the converter 110. The oversampled data stream may be provided to the device 120. Input received at the device 120 from the converter 110 may be provided to a filter section 130 of the device 120 and to a downsample section 140B of the device 120. In various embodiments, the input received at the filter section 130 and the downsample section 140B may be or correspond to the same input from the converter 110 received by the device 120. The filter section 130 may include a Finite Impulse Response (FIR) filter in various embodiments, such as a 4-30 FIR filter. Additionally or alternatively, the filter section may include one or more impulse response (IR) filters, such as one or more infinite impulse response (IIR) filters, in addition or alternative to one or more FIR filters. Output from the Filter Section 130 may be a filtered output provided to a decimation section 140A of the device 120. The decimation section 140A may perform one or more decimation operations and generate a decimated data stream as output. The downsample section 140B may generate a downsampled data stream corresponding to the received oversampled data stream from the converter 110. In various embodiments, the decimation section 140A may be configured to operate at a 1/n clock rate relative to a frequency of the oversampled received input data stream so as to decimate the filtered oversampled input data stream according to a predetermined or dynamically determined clock rate.

As used herein, the term "decimation" may include the process of reducing a sampling rate. In practice, this may include lowpass filtering a signal, then discarding one or more of its samples.

"Downsampling" as used herein may refer to a process of throwing away samples, for example, without performing a lowpass filtering operation. In various implementations, the term "decimation" may loosely refer to "downsampling" without departing from the spirit and scope of the present disclosure.

In various embodiments, a power quality data stream is decimated since the FIR low pass filter is performed before any downsampling operation is performed. A revenue data stream may be downsampled, for example, by dropping one or more samples in contrast to the decimated power quality data stream.

The decimated data stream and the downsampled data stream may be provided to the processor 150. The processor 150 may generate a waveform 160 relating to the decimated data stream generated by the decimation section 140A. Additionally or alternatively, the processor 150 may generate one or more sets of metadata 170 from both the decimated data stream and the downsampled data stream generated by the downsample section 140B. The waveform 160 and/or one or more sets of metadata may be provided to a display unit 180 and/or to a communication unit 190 of the device 100. The display unit 180 may be or include any device or element capable of visually conveying at least a portion of information relating to the device 100 or element or component thereof, including but not limited to at least one input power signal data or metadata (or representation thereof). The display unit 180 may physically and/or logically associated with the device 100 but may additionally or alternatively be physically and/or logically separate from the device 100 (for example, as being communicatively coupleable with the device 100 via a communications network using the communication unit 190). The communication unit 190 may be any wired and/or wireless connection device and/or medium capable of transmitting and/or receiving information, such as via one or more wired and/or wireless communication networks. The communication unit 190 may be configured to permit communications between the device 100 and one or more electronic devices, elements, entities, and/or storage devices or elements without departing from the spirit and scope of the present disclosure (e.g., via one or more wired and/or wireless networks or communication mediums).

As previously described herein, implementations consistent with the present disclosure may be configured to meet International Electrotechnical Commission (IEC) 61000 4-30 current requirements and to provide improved efficiencies over existing systems. Embodiments may include sampling an Analog-to-Digital Converter (ADC) at a sample rate sufficient to apply a Finite Impulse Response (FIR) filter to meet IEC 61000 4-30 Power Quality requirements and at the same time use a decimated data stream for revenue calculations. The 4-30 Power Quality stream may require waveform data to produce a Finite Fourier Transform (FFT). Both the power quality stream and the revenue stream may utilize metadata which includes sum, sum of squares, and/or min/max value over a fraction of the waveform in order to produce accurate results (e.g., as implemented using metadata 170). Implementations consistent with the present disclosure may provide an oversampled data path to support an FIR filter and a decimated path for the revenue data. This may result in waveforms and metadata for power quality and metadata to complete revenue calculations. This is highly efficient compared to existing solutions.

Figure 2A:
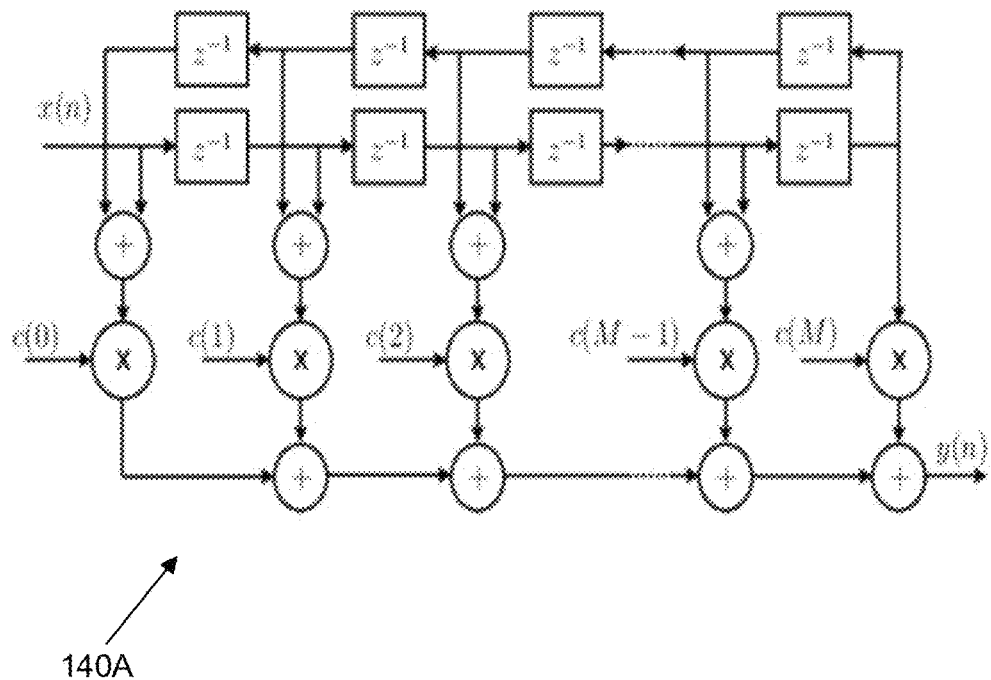
FIG. 2A illustrates an exemplary embodiment of a finite impulse response decimation filter useable according to aspects of the present disclosure.

FIG. 2A illustrates an exemplary embodiment of a finite impulse response decimation filter useable according to aspects of the present disclosure. The decimation section 140A may be accomplished, either in whole or in part via at least one FIR decimation filter, for example as illustrated by FIG. 2A. The FIR decimation filter may receive an input signal x(n) and perform one or more decimation operations to provide a filtered output y(n) at a plurality of stages. The output y(n) may correspond to power quality stream signal generated in relation to the input signal, such as waveform data or data or metadata corresponding thereto.

Figure 2B:
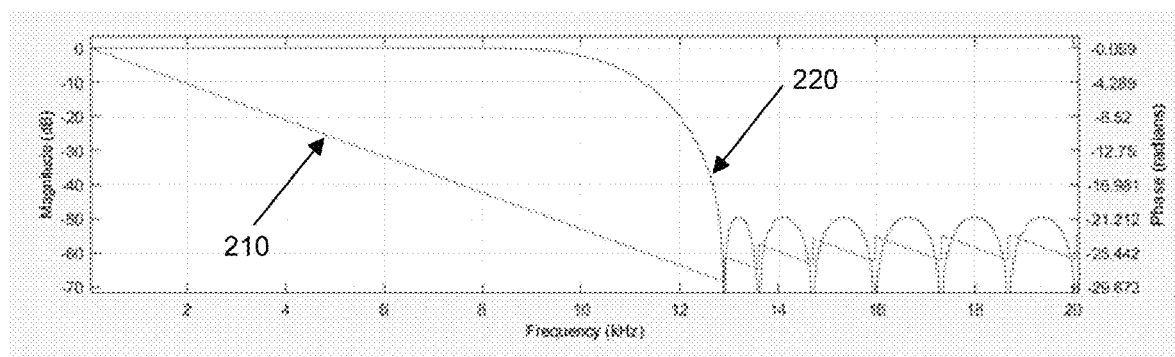
FIG. 2B illustrates a partial view of an exemplary embodiment of a graph of magnitude and phase over a frequency range for a constant phase shift of a Finite Impulse Response (FIR) filter according to aspects of the present disclosure.

FIG. 2B illustrates a partial view of an exemplary embodiment of a graph of magnitude and phase over a frequency range for a constant phase shift of a Finite Impulse Response (FIR) filter according to aspects of the present disclosure. As previously described, one or more FIR filter(s) useable according to aspects of the present disclosure may be linear phase (e.g., including one or more traditional FIR filter(s)). FIG. 2B illustrates a linear phase in radians defined over a frequency range in kilohertz (kHz). The graph 200 provides a phase in radians across a frequency range of 0-20 kHz for a linear phase of an FIR filter useable in accordance with the present disclosure. The line 210 illustrates the phase in radians, while the line 220 illustrates an amplitude (e.g., magnitude) in decibels (dB), each across a frequency range of 0-20 kHz. The specific values provided by FIG. 2B are exemplary and not limiting on the specific phase angle(s) and/or frequency range(s) useable with systems and implementations described herein.

FIG. 3 illustrates a partial block diagram of an exemplary embodiment of a system consistent with the present disclosure. The system illustrated by FIG. 3 incldes a power source 300 coupleable to a power meter 310. The power meter 310 may be a device 100 as previously described herein, may include a device 100, and/or may form at least a portion of a device 100 in various embodiments. The power meter 310 may include one or more of a converter 110, a device 120, a process or 150, a display unit 180, and/or a communication unit 190. The power meter 310 may be configured to receive an input power signal from the power source 300 and to perform one or more operations described herein with reference to device 100, such as handling both power quality and revenue data streams.

Figure 4:
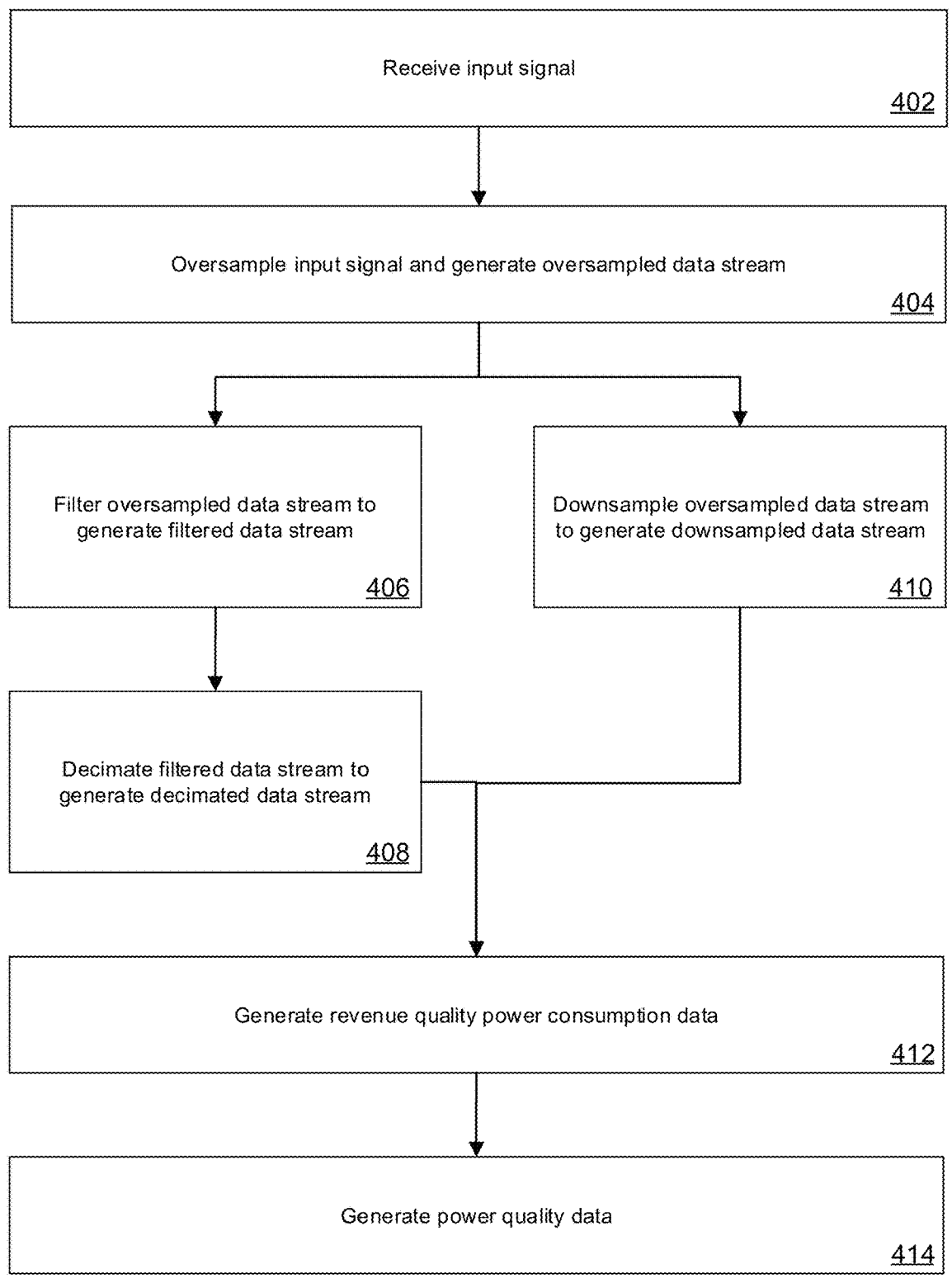
FIG. 4 illustrates a process flow for improving efficiency of power quality and revenue-based computations according to aspects of the present disclosure.

FIG. 4 illustrates a process flow for improving efficiency of power quality and revenue-based computations according to aspects of the present disclosure. A process 400 begins at an operation 402 where an input signal is received, for example at a converter 110. The input signal is oversampled to generate an oversampled data stream at an operation 404. In various embodiments, an oversampling factor or rate may be predetermined or dynamically determined, for example, based at least in part upon an input sample rate from the ADC and/or a desired resulting oversampled data stream data rate or parameter. The process 400 may include filtering the oversampled data stream to generate a filtered data stream at an operation 406 and downsampling the oversampled data stream to generate a downsampled data stream at an operation 410. In various embodiments, a downsampling factor or rate may be predetermined or dynamically determined, for example, based at least in part upon an input or target sample rate and/or a desired resulting downsampled data stream data rate or parameter. In various embodiments, operations 406 and 410 may be performed upon the same oversampled data stream, for example as received at the device 120 from the converter 110. Operations 406 and 408 may be performed along a first path, while operation 410 may be performed along a second path. The filtered data stream generated at operation 406 may be decimated at an operation 408 to generate a decimated data stream. The decimation may be accomplished, for example, based upon after applying a low pass filter (such as an FIR filter) to a data stream, subsequently reducing a sampling rate (e.g., thereby providing efficiency). Because the high frequency component has been removed, the higher sampling rate may not be required.

The decimated data stream generated at operation 408 and the downsampled data stream generated at operation 410 may be used to generate revenue quality power consumption data at operation 412 and may be used to generate power quality data at an operation 414. The power quality data may include, for example, at least one of: current and voltage RMS, phase relationship between waveforms, waveform frequency content information, power factor and frequency, active power (e.g., in kW), reactive power (e.g., in kVAr), apparent power (e.g., in kVA), active energy (e.g., in kWh), reactive energy (e.g., in kVArh) and apparent energy (e.g., in kVAh), harmonic spectrum, total harmonic distortion (THD), total demand distortion (TDD). In accordance with some embodiments of this disclosure, at least a portion of the revenue quality power consumption data and/or power quality data may be visually displayable via the display unit 180 and/or transmitted via the communication unit 190.

Figure 5:
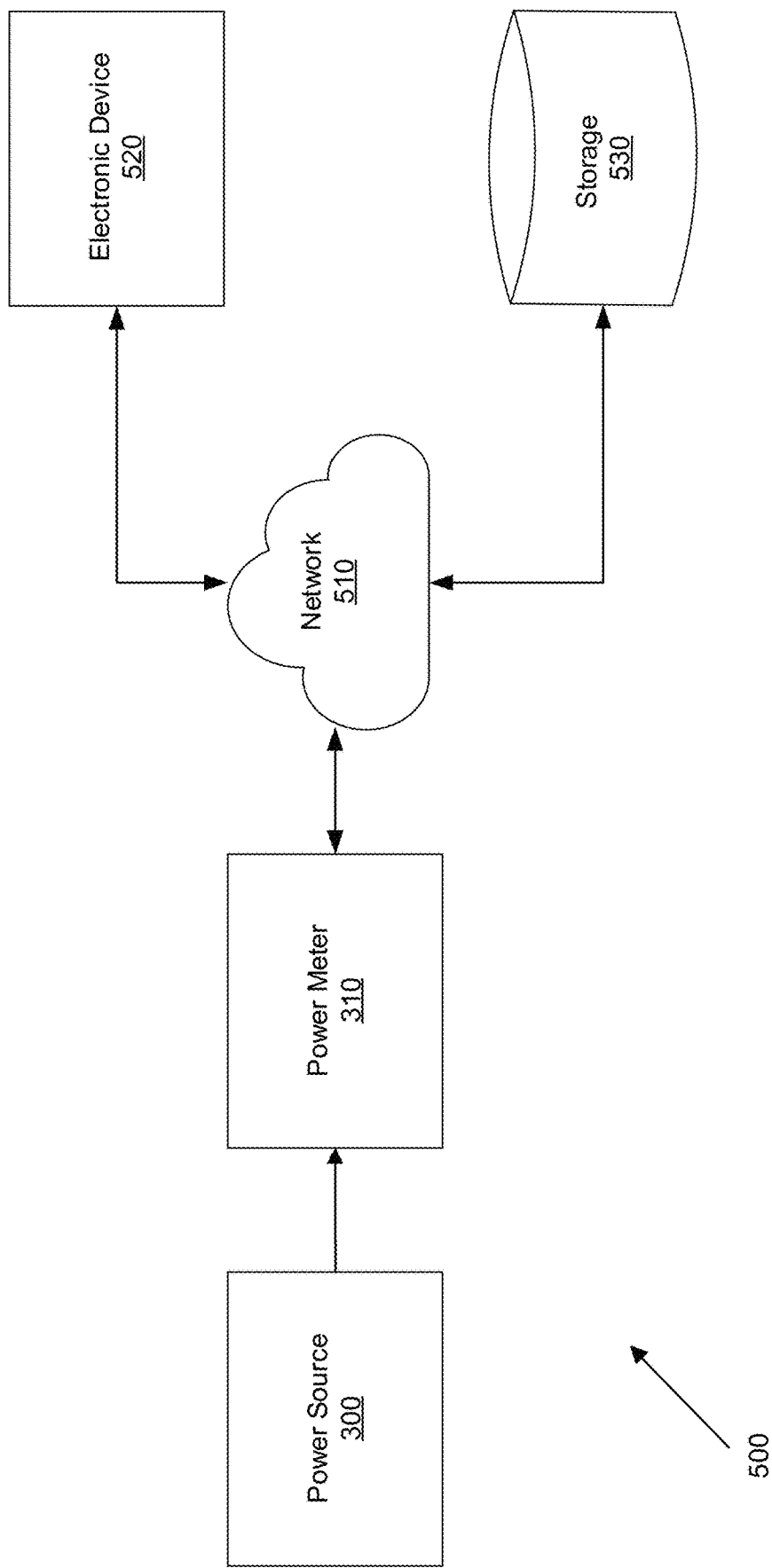
FIG. 5 illustrates a partial block diagram of an exemplary embodiment of a system according to aspects of the present disclosure.

FIG. 5 illustrates a partial block diagram of an exemplary embodiment of a system according to aspects of the present disclosure. The system 500 includes one or more of a power source 300, a power meter 310, a network 510, an electronic device 520, and/or a storage 530. The power meter 310 may be configured to receive at least one input power signal from the power source 300 and to perform one or more power quality and/or revenue data operations described herein. The power meter may be configured to convey at least a portion of information regarding one or more inputs or operations via the display unit 180 thereof. Additionally or alternatively, the power meter 310 may be configured to transmit and/or receive at least a portion of information received at the power meter 310, generated by the power meter 310, and/or useable by the power meter 310. For example, the power meter 310 may be configured to provide waveform 160 data and/or one or more sets of metadata 170 to one or more electronic device 520(s) and/or storage(s) 530 for analysis, presentation, and/or storage in various embodiments. The network 510 may be any public network, private network, or combination thereof capable of communication between the power meter 310 and one or more electronic devices) 520 and/or storage(2) 530. The network 510 may be any wired and/or wireless network or combination of networks. In various embodiments, the network 510 may be and/or include the Internet. One or more communication protocol(s) may be utilized to enable or provide communications via the network 510.

Implementations consistent with the present disclosure may include a method for improving efficiency of power quality and revenue-based computations. The method may include receiving an input signal, oversampling the input signal to generate an oversampled data stream, (i) in a first signal path, filtering the oversampled data stream to generate a filtered data stream, and decimating the filtered data stream to generate a decimated data stream, the filtered data stream and the decimated data stream including waveform data capable of use for generating power quality analysis information, (ii) in a second signal path, downsampling the oversampled data stream to generate the downsampled data stream, generating revenue quality power consumption data based at least in part upon meta data from the downsampled data stream, and generating power quality data based at least in part upon the decimated data stream and associated meta data.

The filtered data stream may have a linear phase shift. The input signal may be received from an ADC. The ADC may provide input signal data at a sample rate, for example, in accordance with power quality requirements (e.g., IEC 61000 4-30 power quality requirements) in some embodiments. Waveform data and metadata or a representation(s) thereof may be visually displayed or transmitted. The method of filtering the oversampled input data stream may include performing an FIR filtering operation. Generating power quality data may include producing an FFT for power quality analysis.

According to aspects of the present disclosure, provided is a device for providing power quality and revenue-based computations. The device may include a converter configured to receive input data and to output a converted data stream, a filter section coupleable to the converter and configured to receive at least a portion of the converted data stream and perform at least one filter operation to generate a filtered data stream, a decimation section configured to receive the filtered data stream and to perform at least one decimation operation on the filtered data stream to generate a decimated data stream, a downsample section configured to receive the converted data stream and to perform at least one downsampling operation to generate a downsampled data stream, and a processor configured to receive the decimated data stream and the downsampled data stream and to generate waveform data and metadata.

The converter may be an ADC. The ADC may provide the converted data stream at a sample rate in accordance with power quality requirements and/or desired parameter(s), such as corresponding to an IEC 61000 4-30 power quality requirement, although any other power quality or additional or alternative preference or requirement may be used without departing from the spirit and scope of the present disclosure. The converted data stream may be an oversampled data stream at the sample rate, for example, in accordance with IEC 61000 4-30 power quality requirements in some embodiments. The converted data stream may be an oversampled data stream. The device may include a display unit which visually conveys one or more of the waveform data and metadata, or a representation thereof. The at least one filter operation may include performing an FIR filtering operation. The converted data stream may have a linear phase shift. The filter section, the decimation section, the downsample section, and the processor may be implemented in whole or in part by an FPGA, DSP, and/or other processing device of the device.

Implementations consistent with the present disclosure may further include a system for providing improving efficiency of power quality and revenue-based computations. The system may include a power source configured to provide output power and a device. The device may include a converter configured to receive the output power from the power source and to output a converted data stream, a filter section coupleable to the converter and configured to receive at least a portion of the converted data stream and perform at least one filter operation to generate a filtered data stream, a decimation section configured to receive the filtered data stream and to perform at least one decimation operation on the filtered data stream to generate a decimated data stream, a downsample section configured to receive the converted data stream and to perform at least one downsampling operation to generate a downsampled data stream, and a processor configured to receive the decimated data stream and the downsampled data stream and to generate waveform data and metadata.

The converter may be an ADC. The ADC may provide the converted data stream a sample rate, for example, in accordance with power quality requirements (e.g., IEC 61000 4-30 power quality requirements) in some embodiments. The converted data stream may be an oversampled data stream at the sample rate. The converted data stream may be an oversampled data stream. The system may further include a display unit used to visually convey one or more of the waveform data and metadata, or a representation thereof. The at least one filter operation may include performing an FIR filtering operation. The converted data stream may have a linear phase shift. The filter section, the decimation section, and the downsample section may be implemented in whole or in part by an FPGA, DSP, and/or other processing device of the device.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method, or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A method for improving efficiency of power quality and revenue-based computations, the method comprising:
   receiving an analog input signal;
   oversampling the input signal to generate an oversampled data stream;
   providing the oversampled data stream, via a coupling, to a first signal path and to a second signal path, wherein the first and second signal paths are independent of one another;

in the first signal path, filtering the oversampled data stream to generate a filtered data stream, and decimating the filtered data stream to generate a decimated data stream, the filtered data stream and the decimated data stream including waveform data capable of use for generating power quality analysis information;

in the second signal path, downsampling the oversampled data stream to generate a downsampled data stream;

generating revenue quality power consumption data based at least in part upon meta data from the downsampled data stream; and generating power quality data based at least in part upon the decimated data stream and associated meta data.

2. The method of claim 1, wherein the filtered data stream has a linear phase shift.

3. The method of claim 1, wherein oversampling the input signal includes performing Analog-to-Digital conversion (ADC).

4. The method of claim 3, wherein the ADC is performed on the input signal data at a sample rate corresponding to International Electrotechnical Commission (IEC) 61000 4-30 power quality requirements.

5. The method of claim 1, further comprising:
displaying one or more of the waveform data and metadata, or a representation thereof.

6. The method of claim 1, wherein the filtering the oversampled input data stream includes performing a Finite Impulse Response (FIR) filtering operation.

7. The method of claim 1, wherein the generating power quality data includes producing a Finite Fourier Transform (FFT) for power quality analysis.

8. The method of claim 1, wherein the filtering, the decimating, and the downsampling are implemented by a Field Programmable Gate Array (FPGA).

9. A device for providing power quality and revenue-based computations, the device comprising:
a converter configured to receive an analog input signal, oversample the input data, and to output a converted data stream that is digital and oversampled;
a filter section coupleable to the converter and configured to receive at least a portion of the converted data stream and perform at least one filter operation to generate a filtered data stream;
a decimation section configured to receive the filtered data stream and to perform at least one decimation operation on the filtered data stream to generate a decimated data stream;
a downsample section configured to receive the converted data stream from the converter and to perform at least one downsampling operation to generate a downsampled data stream, wherein the converted data stream received by the downsample section was not processed by the filter section; and
a processor configured to receive the decimated data stream and the downsampled data stream and to generate waveform data and metadata.

10. The device of claim 9, wherein the converter includes an Analog-to-Digital Converter (ADC).

11. The device of claim 10, wherein the ADC is configured to provide the converted data stream a sample rate corresponding to International Electrotechnical Commission (IEC) 61000 4-30 power quality requirements.

12. The device of claim 11, wherein the converted data stream is oversampled at the sample rate corresponding to IEC 61000 4-30 power quality requirements.

13. The device of claim 9, further comprising:
a display unit configured to visually convey one or more of the waveform data and metadata, or a representation thereof.

14. The device of claim 9, wherein the at least one filter operation includes performing a Finite Impulse Response (FIR) filtering operation.

15. The device of claim 9, wherein the converted data stream has a linear phase shift.

16. The device of claim 9, wherein the filter section, the decimation section, the downsample section, and the processor are implemented in whole or in part by a Field Programmable Gate Array (FPGA) of the device.

17. The device of claim 9, wherein the filter section, the decimation section, and the downsample section are implemented by a Field Programmable Gate Array (FPGA) of the device.

18. A system for providing improving efficiency of power quality and revenue-based computations, the system comprising:
a power source configured to provide output power; and
a device, including:
a converter configured to receive the output power from the power source as an analog input, oversample the input data, and to output a converted data stream that is digital and oversampled;
a filter section coupleable to the converter and configured to receive at least a portion of the converted data stream and perform at least one filter operation to generate a filtered data stream;
a decimation section configured to receive the filtered data stream and to perform at least one decimation operation on the filtered data stream to generate a decimated data stream;
a downsample section configured to receive the converted data stream from the converter and to perform at least one downsampling operation to generate a downsampled data stream, wherein the converted data stream received by the downsample section was not processed by the filter section; and
a processor configured to receive the decimated data stream and the downsampled data stream and to generate waveform data and metadata.

19. The system of claim 18, wherein the converter includes an Analog-to-Digital Converter (ADC).

20. The system of claim 19, wherein the ADC is configured to provide the converted data stream a sample rate corresponding to International Electrotechnical Commission (IEC) 61000 4-30 power quality requirements.

21. The system of claim 20, wherein the converted data stream is oversampled at the sample rate corresponding to IEC 61000 4-30 power quality requirements.

22. The system of claim 18, further comprising:
a display unit configured to visually convey one or more of the waveform data and metadata, or a representation thereof.

23. The system of claim 18, wherein the at least one filter operation includes performing a Finite Impulse Response (FIR) filtering operation.

24. The system of claim 18, wherein the converted data stream has a linear phase shift.

25. The system of claim 18, wherein the filter section, the decimation section, and the downsample section are implemented by a Field Programmable Gate Array (FPGA) of the device.

* * * * *